United States Patent

Mahgerefteh

[11] Patent Number: 6,104,851
[45] Date of Patent: Aug. 15, 2000

[54] TRANSMISSION SYSTEM COMPRISING A SEMICONDUCTOR LASER AND A FIBER GRATING DISCRIMINATOR

[76] Inventor: Daniel Mahgerefteh, 3005 Porter St. NW., Washington, D.C. 20008

[21] Appl. No.: 09/065,686

[22] Filed: Apr. 24, 1998

[51] Int. Cl.[7] .................................................. G02B 6/34
[52] U.S. Cl. .............................................. 385/37; 385/24
[58] Field of Search ................................ 385/24, 37, 1

[56] References Cited

U.S. PATENT DOCUMENTS

| | | | |
|---|---|---|---|
| 5,416,629 | 5/1995 | Huber | 359/182 |
| 5,724,167 | 3/1998 | Sabella | 359/128 |
| 5,875,273 | 2/1999 | Mizrahi et al. | 385/37 |
| 5,974,209 | 10/1999 | Cho et al. | 385/28 |

OTHER PUBLICATIONS

McAdams et al, Technical Digest, CLEO 1997, pp. 447–448.
Timofeev et al, Technical Digest, CLEO 1997, p. 296.
Lee et al, Technical Digest, CLEO 1995, vol. 15, p. 93.
Morton et al, Electronic Letter, vol. 33, p. 310, 1997.

*Primary Examiner*—Hung N. Ngo

[57] ABSTRACT

The optical signal produced by a modulated semiconductor laser is passed through a fiber grating optical discriminator to increase the modulation response of the device and decrease the output chirp for transmission through optical fiber.

22 Claims, 9 Drawing Sheets

TRANSMISSION SYSTEM COMPRISING A SEMICONDUCTOR LASER AND A FIBER GRATING DISCRIMINATOR

BACKGROUND OF THE INVENTION

The invention relates to semiconductor laser transmitters for use in fiber-optic communication systems.

Directly modulated semiconductor lasers are attractive for use as transmitters in optical communication because they are compact, have large response to modulation, and are integrable. In addition they are inexpensive compared to externally-modulated transmitters, which require an intensity modulator, usually $LiNbO_3$, following the laser. However, they suffer from the major drawback that their outputs are highly chirped. Chirp is the rapid change in optical frequency or phase that accompanies an intensity-modulated signal. Chirped pulses become distorted after propagation through tens of km of dispersive optical fiber, increasing system power penalties to unacceptable levels. This has limited the use of directly modulated laser transmitters to propagation distances of only tens of km at 2.5 Gb/s as described by P. J. Corvini and T. L. Koch, *Jounral of Lightwave Technology* vol. LT-5, no. 11, 1591(1987). The distortion-less transmission distances become even shorter for higher bit rates.

An alternative transmission system that produces reduced chirp was described by R. E. Epworth in UK patent GB2107147A in which the modulated laser is followed by an optical frequency discriminator. The laser bias current is modulated by the electrical signal to produce small amplitude modulation as well as modulation of the laser frequency. The discriminator then converts the FM modulation to AM modulation. Epworth cites classic optical discriminators, namely Mach-Zehnder interferometer, Michelson interferometer, and two Fabry-Perot resonators for implementation of this invention. N. Henmi describes a very similar system in U.S. Pat. No. 4,805,235, also using a free-space interferometer.

The above are all free-space discriminators comprising mirrors and partial reflectors which are bulky and require mechanical feed-back control for their stabilization. Also coupling of light from fiber to these devices and back introduces loss as well as additional optical components. Furthermore tuning the discriminator for optimum position requires a mechanical adjustment of the phase differential -in one arm of the interferometer. As stated in UK patent GB2107147A, the modulated laser frequency varies by only 10–20 GHz, so to obtain a 10 GHz frequency discrimination, a~1.5 cm free-space delay is needed, which requires use of mechanically driven parts. Piezoelectric elements can only make small motions and are known to drift, requiring further stabilization circuits.

N. Henmi in U.S. Pat. No. 4,805,235, also sites the use of a diffraction grating discriminator. To obtain 10–20GHz frequency discrimination as stated above, the diffraction grating has to have a resolution of a few GHz to discriminate between the "1s" and "0s" in a digital system. From "*The Feynman Lectures on Physics*," vol. I, Addision Wesley, Mass. (1963), a frequency resolution $\Delta v \sim 1$ GHz requires a time difference between extreme paths of $\Delta t \sim 1/ \Delta v$ 1ns corresponding to a larger than 1 ft wide diffraction grating. As described in U.S. Pat. No. 4,805,235, light beams of different frequency components have to diffract before they are separated by slits a distance away from the diffraction grating. This makes for a bulky device. Also, as for the other freespace space optics discriminators mentioned above, it suffers from fiber coupling loss and requires mechanical tuning.

In U.S. Pat. No. 5,317,384, J. P King describes a fiber Mach-Zehnder interferometer as discriminator comprising polarization-preserving fibers, couplers, and a fiber delay line. This discriminator is an improvement over the previously mentioned discriminators in that it is in-fiber and is polarization insensitive. Discrimination is achieved by making one arm of the interferometer longer length of fiber (we calculate, by ~1 cm longer for 10 GHz variation). This has the disadvantage that the discriminator cannot be tuned. Also, it is a complicated structure comprising two fiber polarization splitters, two fiber couplers, four cross splices and a regular splice.

Furthermore the transfer function of a Mach-Zehnder discriminators is limited to being sinusoidal. For digital applications, a sinusoidal transfer function is not optimum and leads to distortion if the frequency excursion of the laser exceeds the range of the transfer function between a first maximum and minimum.

SUMMARY OF THE INVENTION

The object of this invention is a transmission system comprising a modulated semiconductor laser and a simple, tunable, fiber-based, polarization insensitive optical discriminator capable of providing an output with reduced chirp and with adjustable sign of chirp. According to an aspect of this invention, the current of a semiconductor laser is modulated while it is biased high above threshold. The frequency-modulated output of the laser is passed through a fiber grating discriminator with step-like spectrum such that the laser frequency varies between the ~0 and ~100% transmission regions of the grating spectrum for the logical 0 and 1 bits, respectively. The sign of slope of the step determines the sign of chirp.

Another object of this invention is an all-optical wavelength converter comprising a semiconductor laser and a fiber grating discriminator. The semiconductor laser is modulated by an optical signal of a different wavelength and the modulated output is passed through the discriminator as described above. The sign of slope of the step determines the sign of chirp.

DETAILED DESCRIPTION OF THE PREFERRED EMBODIMENT

Figure 1:
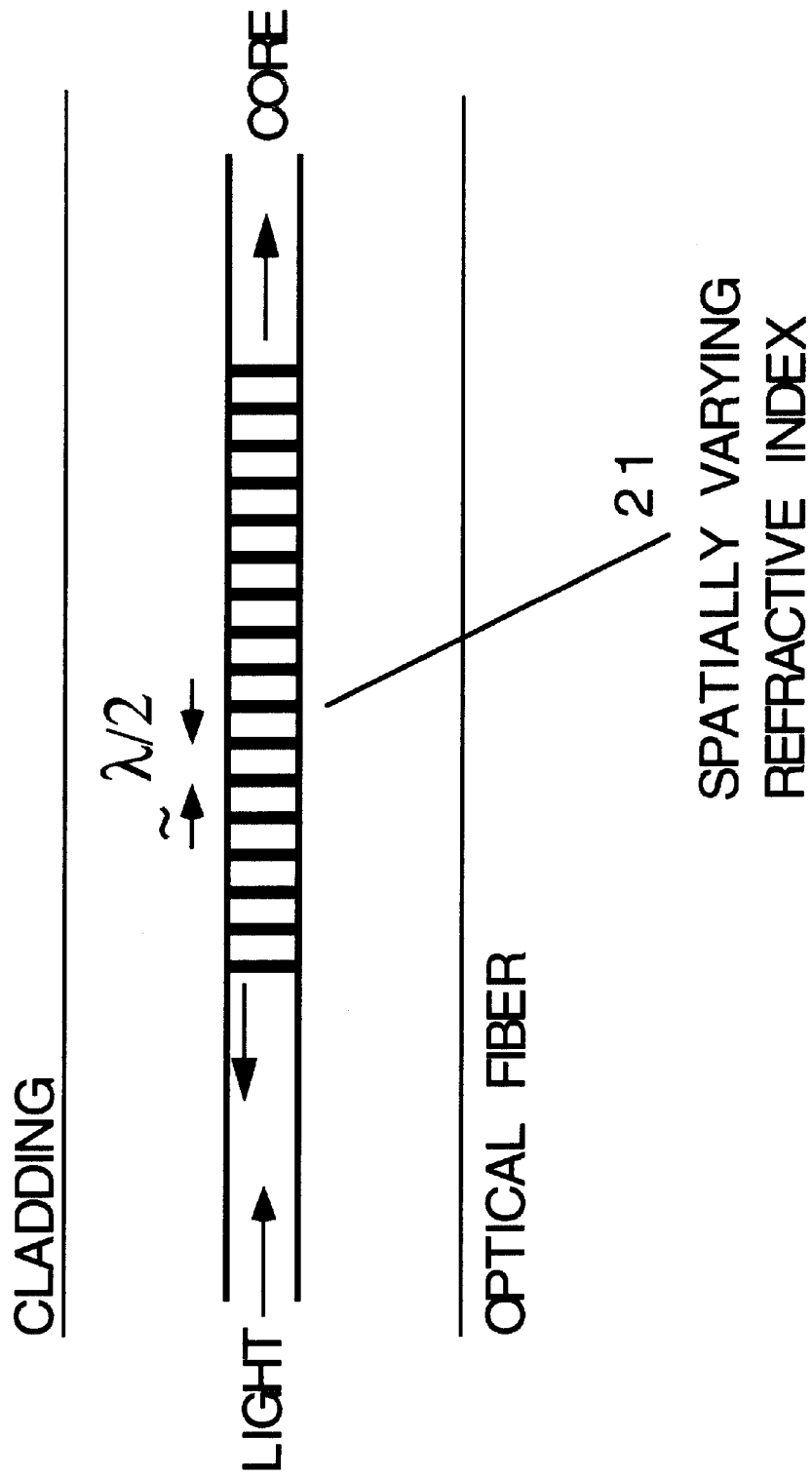
FIG. 1 Fiber Bragg grating optical discriminator.

The key to this invention is a fiber grating optical discriminator shown in FIG. 1 with a transmission function that can be designed for various applications. The fiber grating comprises a spatially varying refractive index modulation 21 along the propagation direction in an optical fiber. The index variation is produced by exposing an optical fiber to a spatially varying intensity pattern at ultraviolet wavelength as described by K. O. Hill and G. Meltz in *J. Lightwave Technol.*vol. 15, pp. 1263–1276(1997). The fiber grating couples light traveling in the fiber from one fiber mode to another, thus forming an optical transmission or reflection filter. Fiber grating spectra can be tailored by the pattern design used in its formation as described by T. Erdogan in *J. Lightwave Technol.* vol. 15, pp. 1277–1294(1997).

Relevant to the present invention, fiber grating spectra can be made to have sharp transitions between ~0% and ~100% transmission as a function of optical frequency. The edge of transmission or reflection band of a fiber grating thus forms our optical frequency discriminator. Fiber gratings are polarization insensitive and can be temperature tuned.

Figure 2:
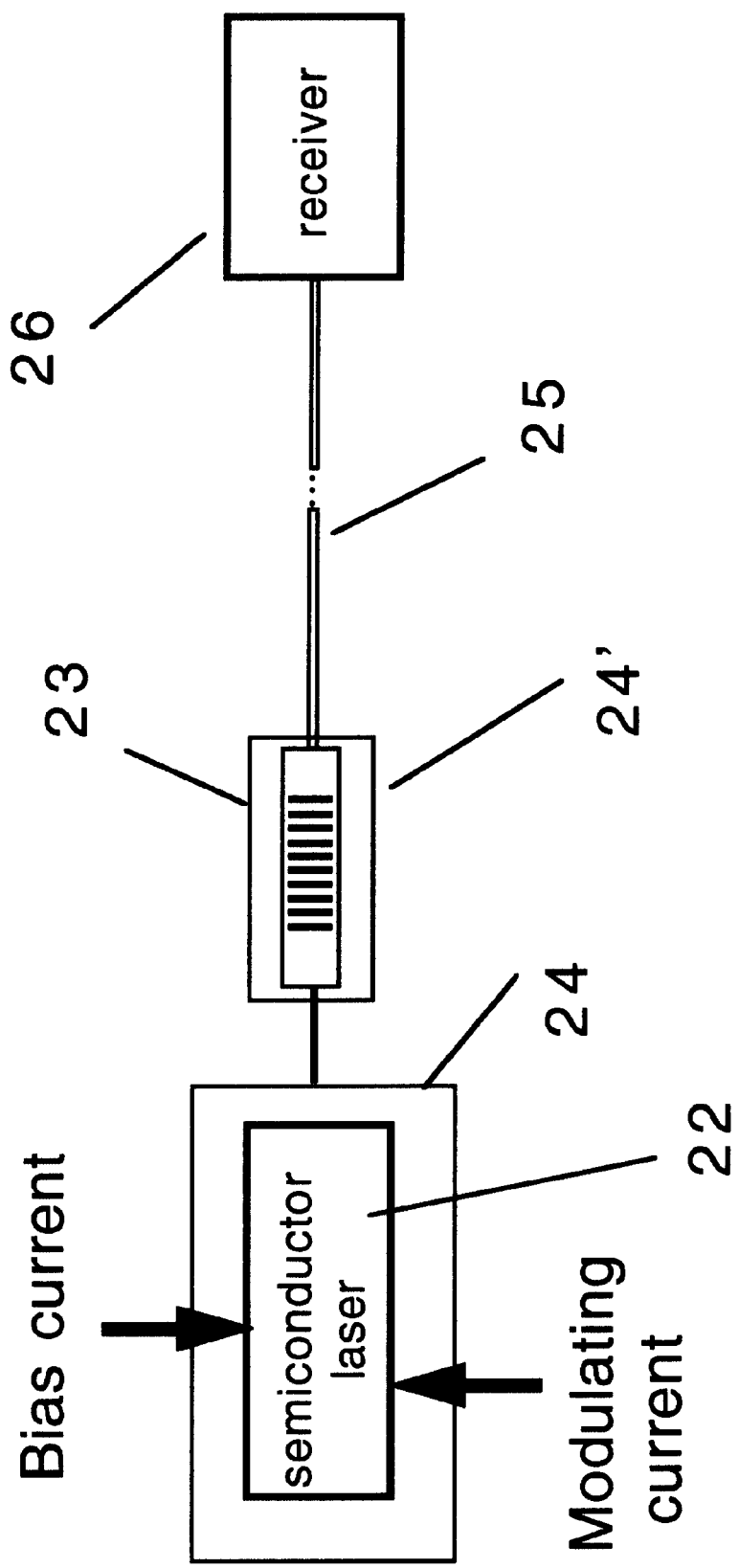
FIG. 2 Laser transmitter comprising a fiber Bragg grating discriminator.
Figure 3:
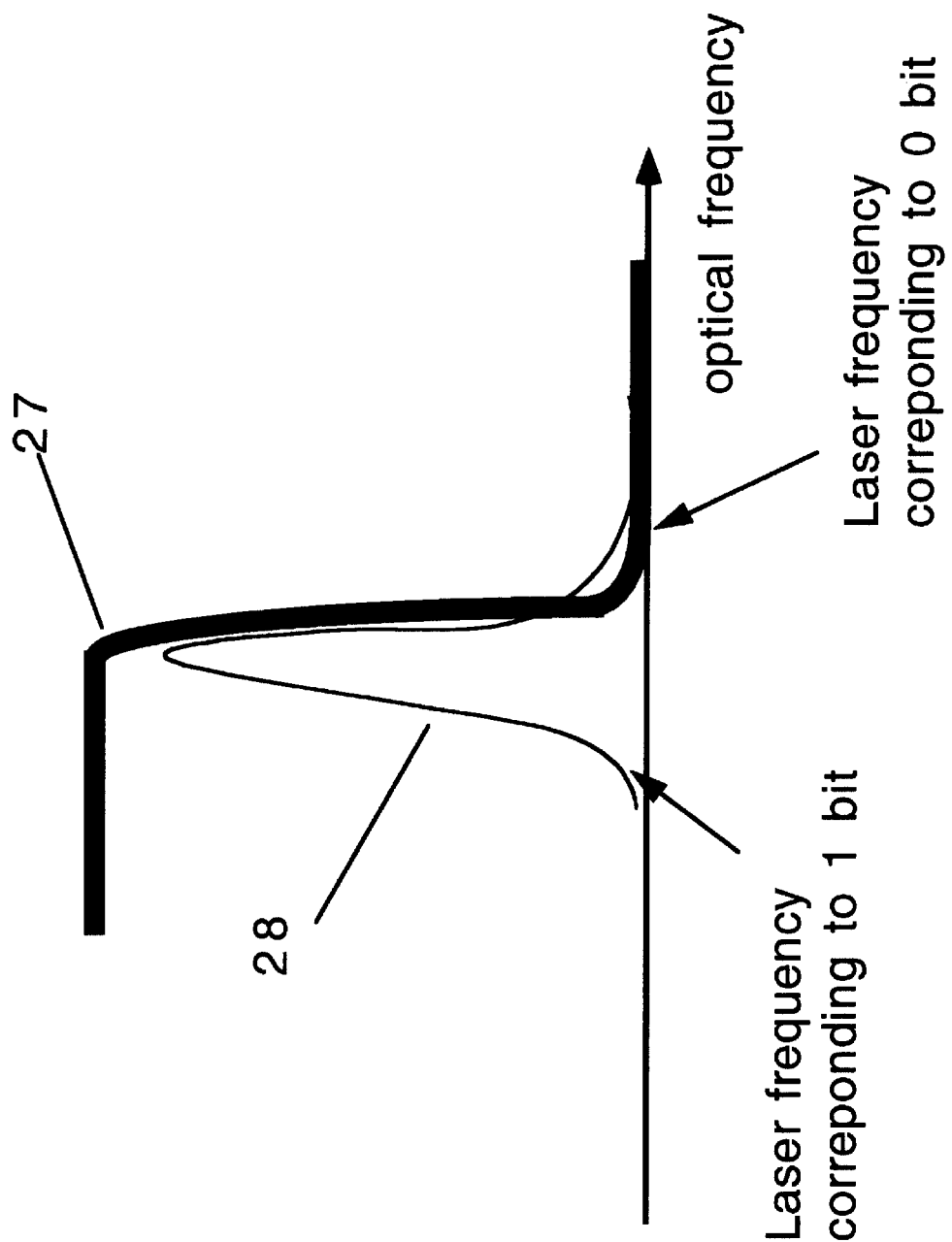
FIG. 3 Placement of laser spectrum relative to fiber grating spectrum for non-inverting operation of transmitter.

Our invention shown in FIG. 2 is to bias a semiconductor laser 22 high above its lasing threshold and to modulate the laser with a small electrical signal, while a fiber grating discriminator 23 with step-like spectrum is placed after the laser. The temperature of the laser and fiber grating are kept fixed by temperature controllers 24 and 24'. The output of the fiber grating is transmitted through a length of optical fiber 25 and the signal detected with a receiver 26. The laser and/or fiber grating are adjusted such that the laser frequency varies between the two frequencies corresponding to the ~0 and ~100% transmission regions of the grating spectrum 27 for the logical 0 and 1 bits, respectively as shown in FIG. 3. The spectrum of laser 28 and the fiber grating discriminator 27 can be tuned relative to each other by changing temperature of either device. It is known that the fiber grating spectrum shifts by changing the fiber temperature. If desired, the spectrum of the fiber grating can also be made insensitive to temperature variations by attaching it to a support member having a negative coefficient of thermal expansion as described in U.S. Pat. No. 5,694,503. Also, the fiber grating spectrum can be tailored such that the step transition is on the order of the frequency excursion of the laser upon modulation (~10–20 GHz).

The fiber grating discriminator described in this invention is insensitive to the polarization of the incident light. The shape of the spectrum of the fiber grating can be tailored to flatten out the frequency response of the driving circuit and laser.

Figure 4:
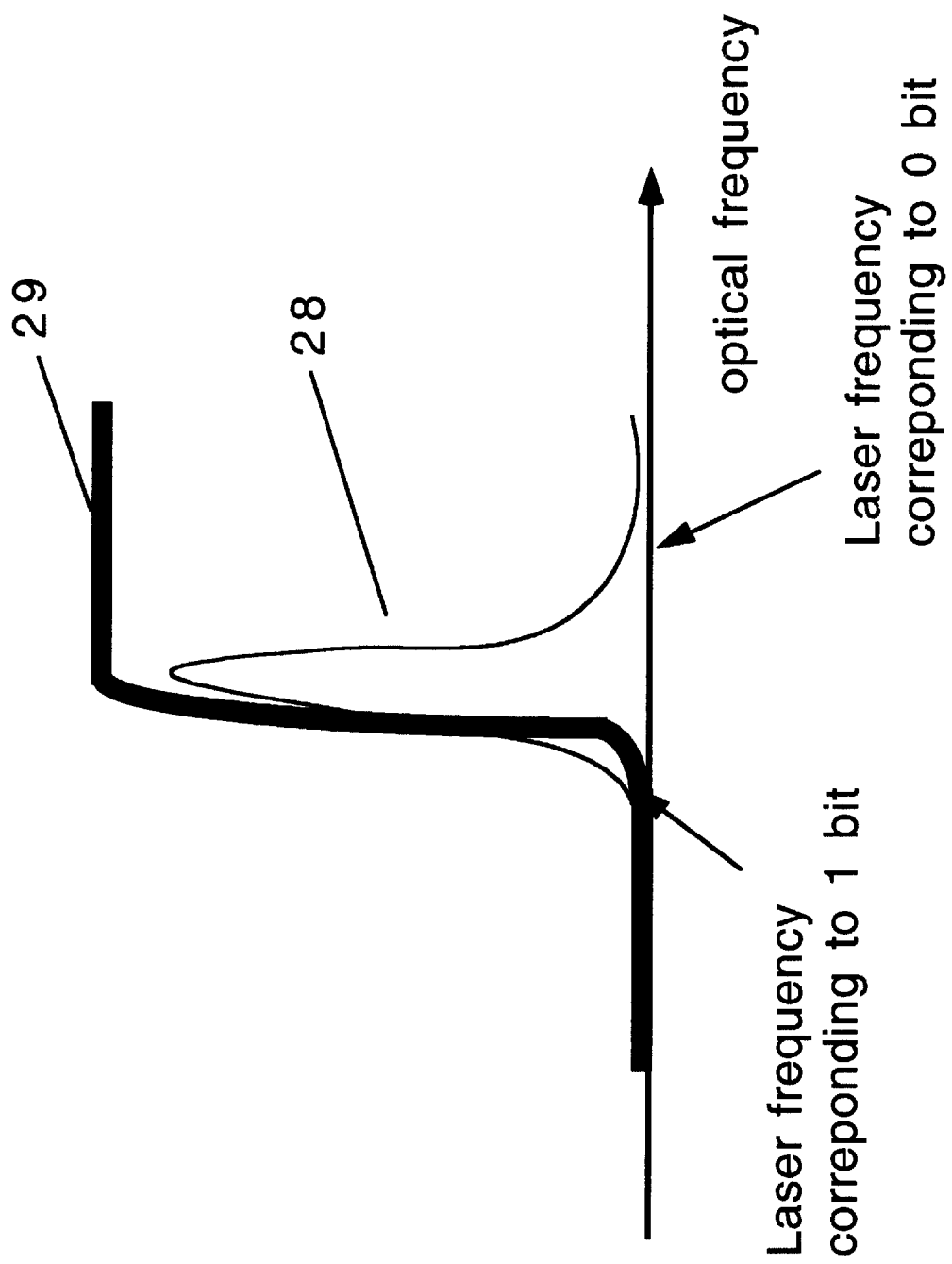
FIG. 4 Placement of laser spectrum relative to fiber grating spectrum for inverting operation of transmiter.
Figure 5:
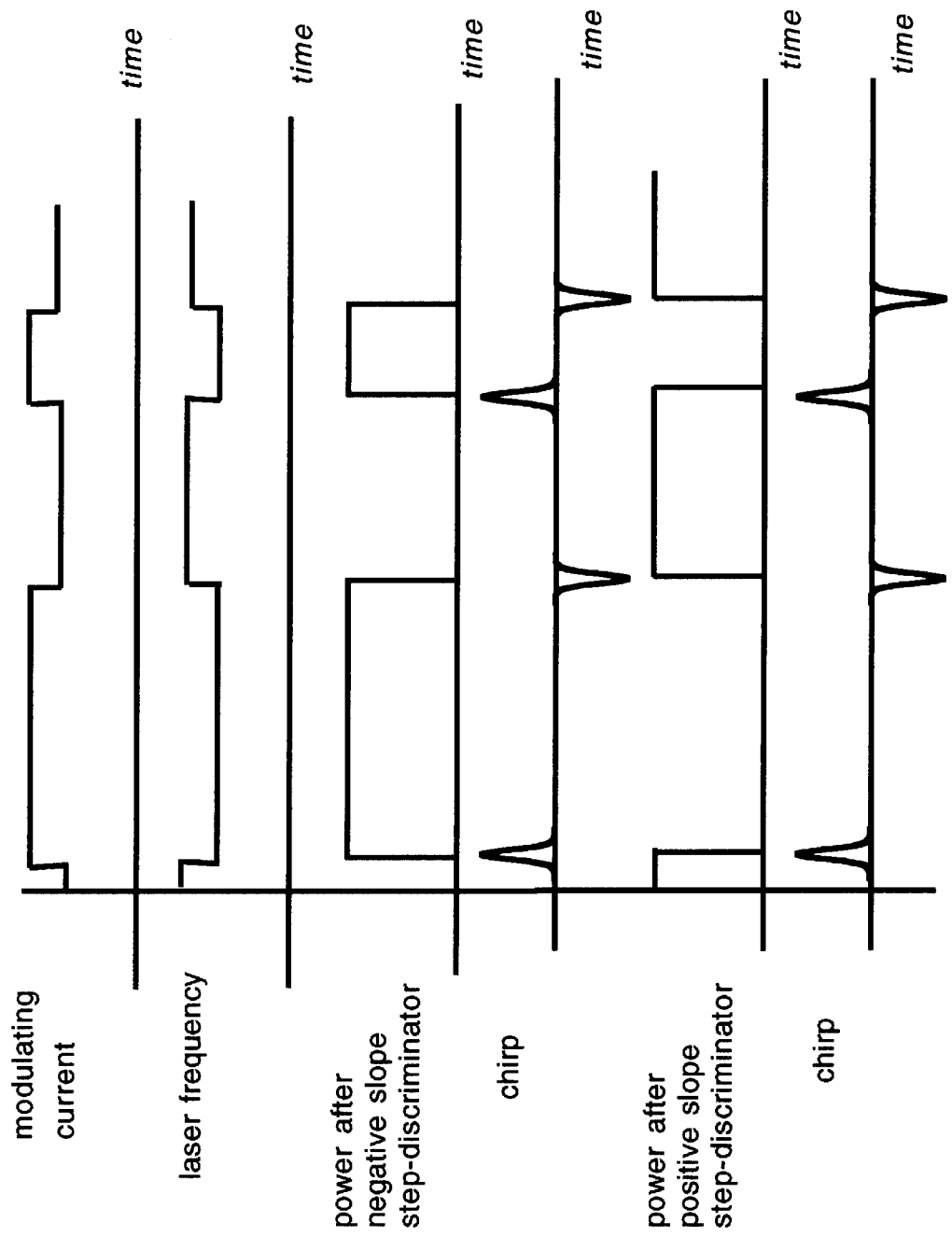
FIG. 5 Modulating current laser frequency, output of transmitter, and chirp of transmitter for inverting and non-inverting operations.

The output optical data produced in this way has a small chirp since the gain variation of the laser and the corresponding frequency modulation at the transitions of is and 0s are small. Choosing a negative slope step as shown in FIG. 3 produces an optical data stream which is not inverted relative to the electrical drive current, while choosing a fiber grating spectrum 29 with negative-slope step for the same laser spectrum 28 as shown in FIG. 4 produces inverted data. FIG. 5 shows the modulation current, optical frequency, and inverting and non-inverting data outputs. The significance of control over the polarity of the optical data for the two cases is that it controls the sign of chirp. For the non-inverted case, the leading pulse edges are blue-chirped, while the trailing pulse edges are red-chirped. For inverted configuration the leading edge is red-chirped, while the trailing edge is blue-chirped. It is known that choice of the sign of chirp for a given sign of dispersion in a fiber can increase the distortion-free transmission distance of optical pulses in the fiber as described in "Nonlinear Fiber Optics," G. P. Agrawal, Academic Press, NY, pp. 58–59(1989).

Figure 6:
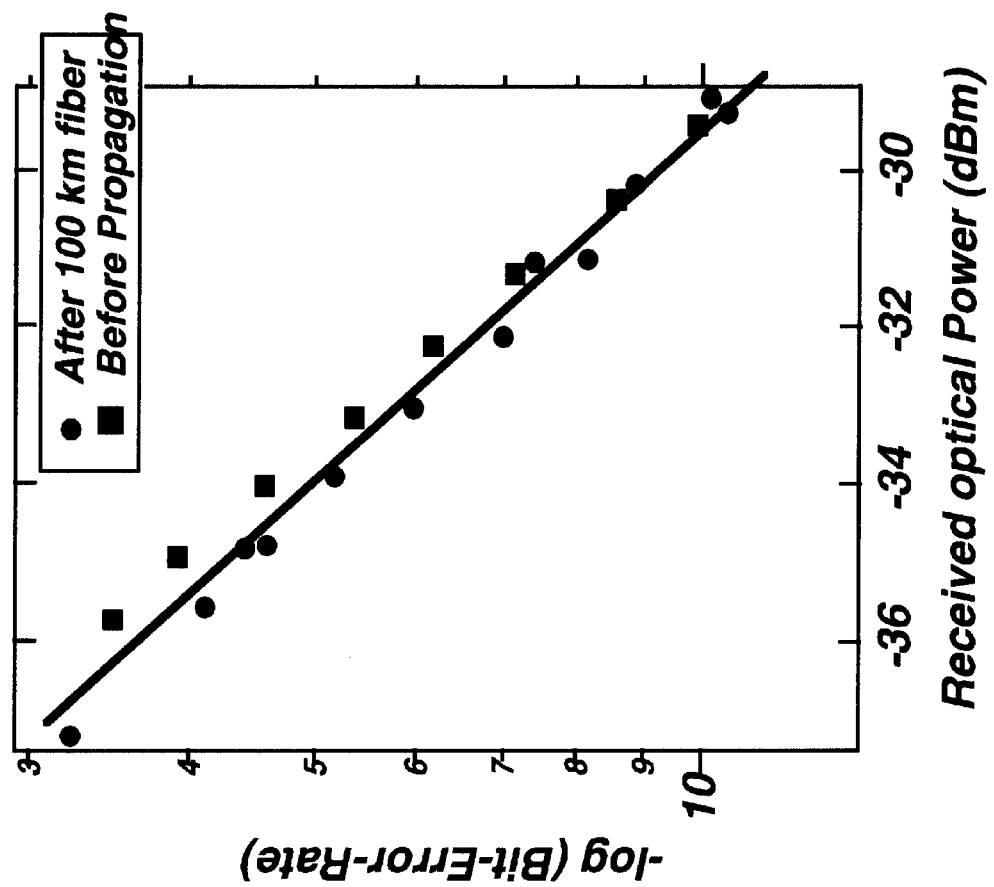
FIG. 6 Bit-error-rate performance of a laser transmitter based on the present invention.

We applied this invention to demonstrate a transmitter comprising a distributed feed-back laser operating at 1546 nm, a fiber Bragg grating discriminator and a length of non-dispersion shifted optical fiber with zero dispersion near 1310 nm. The laser current was modulated using non-return-to-zero (NRZ) data from a bit-error-rate test set at 5 Gb/s. Non-return-to-zero refers to a binary data format in which the signal is not reset to zero between bits. The bias current of the laser was high above threshold. FIG. 6 shows the bit-error-rate curves at the output of the fiber grating and after 100 km of propagation through non-dispersion shifted fiber at 5 Gb/s. There is no power penalty incurred after propagation indicating that the pulses have little or no chirp. Also the extinction ratio of the output was ~10. Error-free transmission was not possible without the fiber grating discriminator even at a lower bit rate of 2.5 Gb/s and a shorter distance of 60 km.

Figure 7:
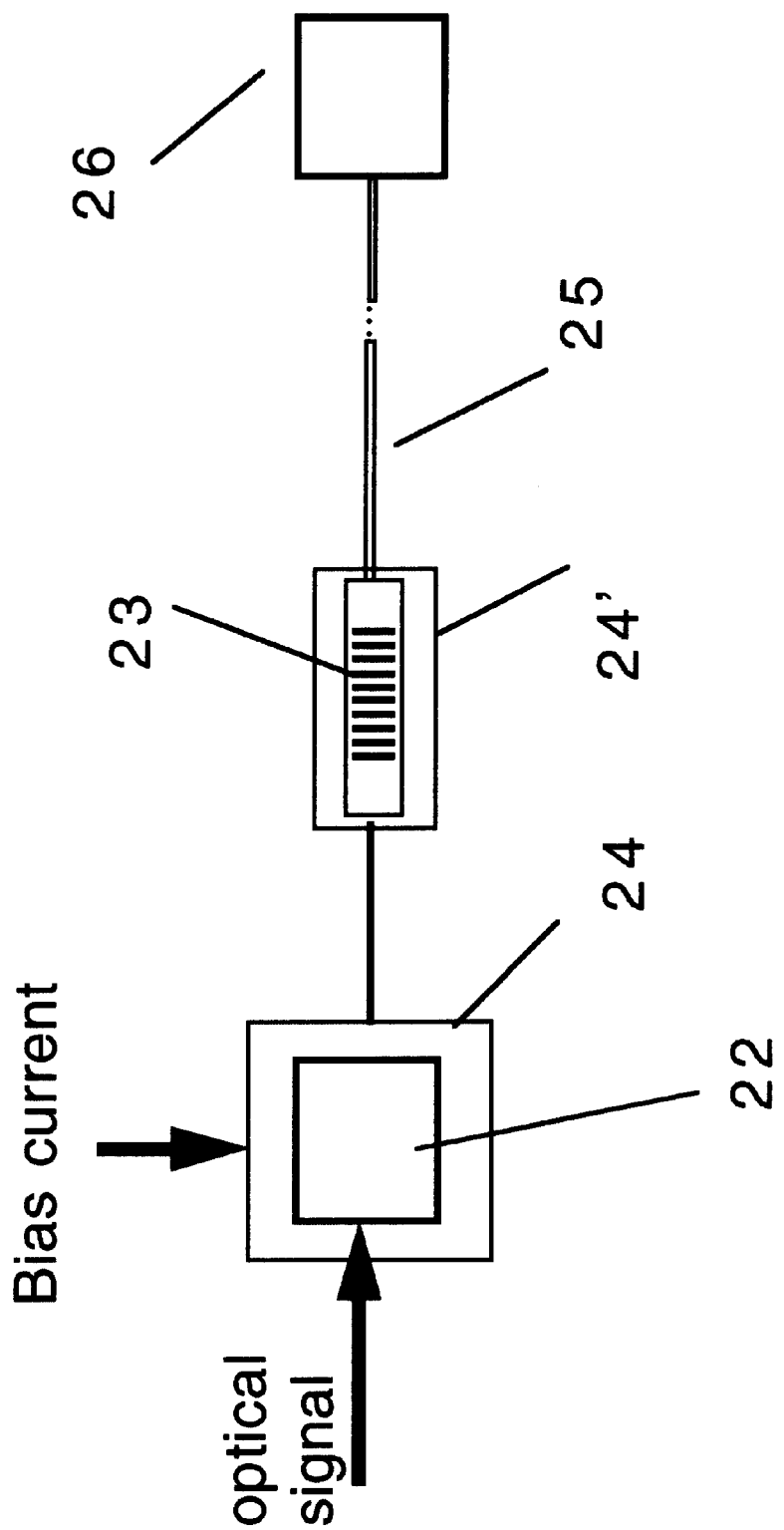
FIG. 7 Optical wavelength converter based on the present invention.

Another embodiment of the present invention is shown in FIG. 7 in which the output intensity and frequency of a semiconductor laser 22 is modulated by an optical signal at a different wavelength. The output of the laser 22 is passed through a fiber grating discriminator 23. The spectrum of the laser and fiber grating discriminator are adjusted as described above for inverted or non-inverted output data. This data is transmitted through an optical fiber 25 before being detected by a receiver some distance away 26. This forms an all-optical wavelength converter with high extinction ratio, low chirp, and high speed of operation.

Figure 8:
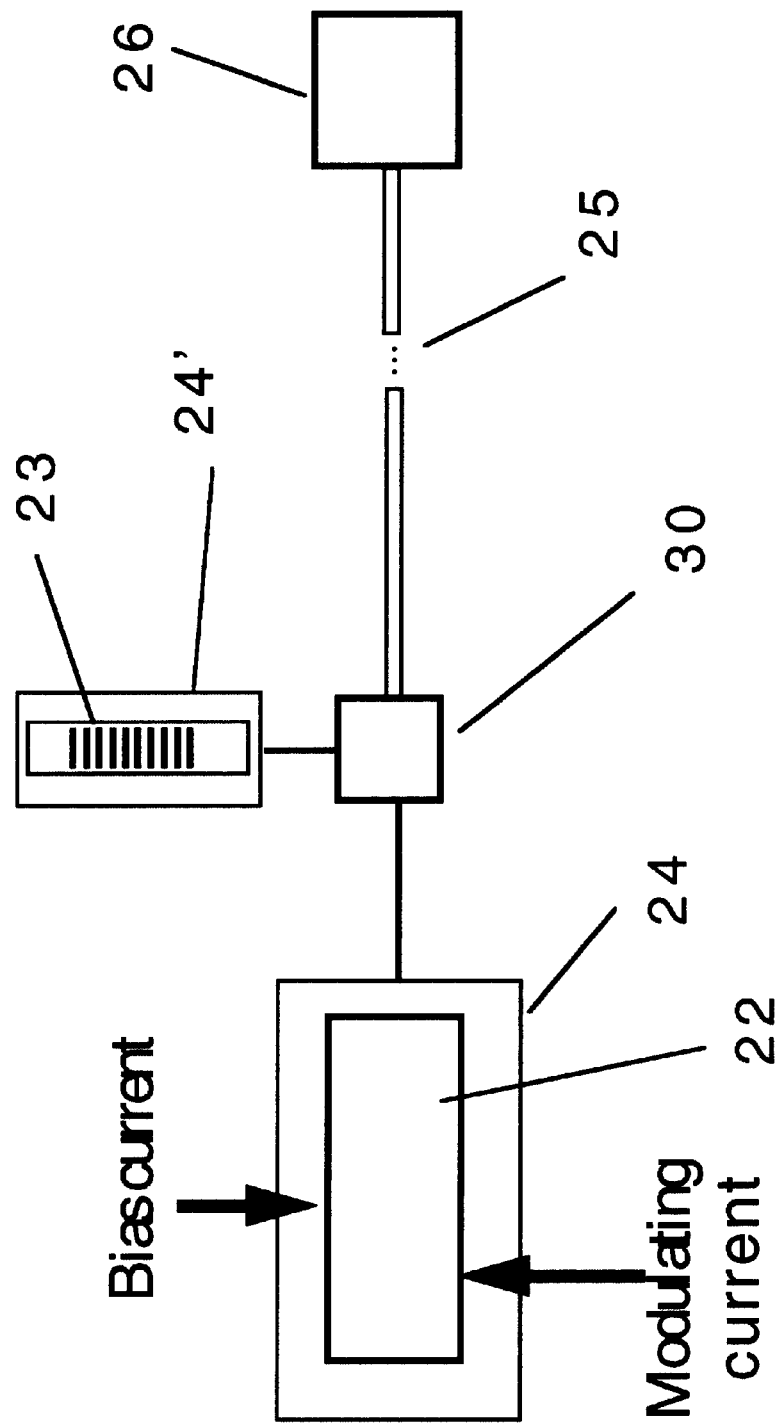
FIG. 8 Laser transmiter with fiber grating used in reflection.
Figure 9:
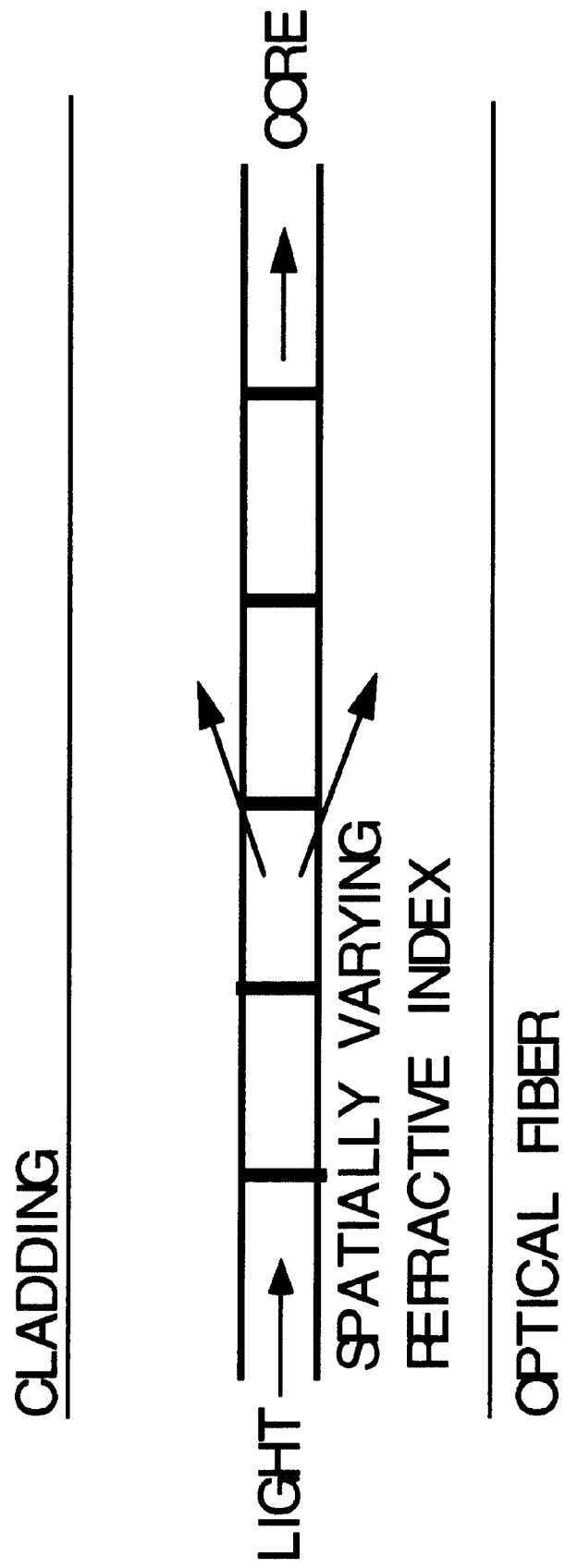
FIG. 9 Graphical representation of a long-period fiber grating discriminator.

It is understood that a fiber grating can be operated in reflection, in which case an optical circulator 30 can be used between the laser and fiber grating discriminator as shown in FIG. 8. It is also understood that the fiber grating can be either a short-period grating or a long-period grating. In a short-period grating light is coupled from the forward-going core mode to the back-ward-going core mode. In a long-period fiber grating, the forward-going core mode is coupled into cladding modes as shown in FIG. 9. If desired, the spectrum of the long-period grating can be made insensitive to temperature variations by proper design of fiber composition and index profile as described in U.S. Pat. No. 5,703,978.

Also, in another embodiment of this invention, the fiber grating discriminator can be placed after the transmission fiber at the receiver.

What is claimed is:

1. A transmission system, comprising: a semiconductor laser, a modulator to frequency modulate the optical output of said laser, a fiber grating discriminator to convert the frequency modulation of said optical output into intensity modulation, wherein said modulator frequency modulates said laser with binary digital signal, and said discriminator converts said binary digital signal into intensity modulated binary digital data.

2. A transmission system as described in claim 1, wherein said discriminator is a fiber grating optical filter.

3. A transmission system as described in claim 2, wherein said fiber optical filter is a transmission filter.

4. A transmission system as described in claim 2, wherein said fiber optical filter is a reflection filter.

5. A transmission system as described in claim 4, further comprising a circulator between the laser and the fiber grating discriminator.

6. A transmission system as described in claim 2, wherein said binary digital signal is reset to zero between two successive digital bits.

7. A transmission system as described in claim 2, wherein the center frequency of said modulating frequency lies in the middle of the transition region of the frequency spectrum of the filter.

8. A transmission system as described in claim 7, wherein said center frequency is in middle of transition region with negative slope to produce said binary digital data which is not inverted relative to the electrical current modulating said laser.

9. A transmission system as described in claim 7, wherein said center frequency is in middle of transition region with positive slope to produce said binary digital data which is inverted relative to the electrical current modulating said laser.

10. A transmission system as described in claim 2, wherein said fiber grating has a long period and couples light from core mode to cladding modes.

11. A transmission system as described in claim 2, wherein said signal modulating said laser is an electrical signal.

12. A transmission system as described in claim 2, wherein said signal modulating said laser is an optical signal.

13. A method of transmitting a digital optical signal using a semiconductor laser diode, comprising the steps of:

modulating said laser diode with an input signal to produce a frequency modulated signal, and passing said frequency modulated signal through a fiber grating filter to convert said frequency modulated signal into an intensity modulated signal;

wherein the center frequency of said frequency modulated signal lies in the middle of the transition region of the frequency spectrum of the fiber.

14. A method as described in claim 13, wherein said input signal is a binary digital signal.

15. A method as described in claim 14, wherein said digital signal is reset to zero between bits.

16. A method as described in claim 13, wherein said transition has positive slope.

17. A method as described in claim 13, wherein said transition has negative slope.

18. A method as described in claim 13, wherein said laser is current modulated.

19. A method as described in claim 13, wherein said laser is optically modulated.

20. A method as described in claim 13, wherein said fiber grating filter operates in forward-going core mode.

21. A method as described in claim 13, wherein said fiber grating operates in backward-going core mode.

22. A method as described in claim 20, wherein said fiber grating has long period to couple a forward-going core mode into a cladding mode.

* * * * *